United States Patent
Fleming et al.

(10) Patent No.: US 6,290,859 B1
(45) Date of Patent: Sep. 18, 2001

(54) TUNGSTEN COATING FOR IMPROVED WEAR RESISTANCE AND RELIABILITY OF MICROELECTROMECHANICAL DEVICES

(75) Inventors: James G. Fleming; Seethambal S. Mani, both of Albuquerque; Jeffry J. Sniegowski, Edgewood; Robert S. Blewer, Albuquerque, all of NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/439,103

(22) Filed: Nov. 12, 1999

(51) Int. Cl.[7] .............................. H01L 21/00; B44C 1/22
(52) U.S. Cl. ................................ 216/2; 134/1.2; 134/1.3; 134/26; 216/58; 216/99; 427/248.1; 427/307; 427/399; 428/446; 438/704; 438/706; 438/745; 438/752; 438/753; 438/765
(58) Field of Search ............................. 216/2, 58, 67, 216/79, 83, 99; 134/1.1, 1.2, 1.3, 26, 28, 29; 438/704, 706, 719, 734, 745, 749, 752, 753, 765; 428/446; 427/248.1, 307, 399

(56) References Cited

U.S. PATENT DOCUMENTS

| | | | |
|---|---|---|---|
| 4,540,607 | 9/1985 | Tsao | 427/253 |
| 4,685,996 | 8/1987 | Busta | 156/628 |
| 4,746,621 | 5/1988 | Thomas | 437/24 |
| 5,072,288 | 12/1991 | MacDonald | 357/68 |
| 5,149,673 | 9/1992 | MacDonald | 437/192 |
| 5,346,719 * | 9/1994 | Zarnoch et al. | 427/399 X |
| 5,399,415 | 3/1995 | Chen | 428/209 |
| 5,596,219 | 1/1997 | Hierold | 257/467 |
| 5,619,061 | 4/1997 | Goldsmith | 257/528 |
| 5,631,514 | 5/1997 | Garcia | 310/309 |
| 5,719,073 | 2/1998 | Shaw | 437/228 |
| 5,804,084 | 9/1998 | Nasby | 216/2 |
| 5,830,372 | 11/1998 | Hierold | 216/2 |
| 5,846,849 | 12/1998 | Shaw | 438/52 |
| 5,847,454 | 12/1998 | Shaw | 257/734 |

OTHER PUBLICATIONS

E.K. Broadbent and C.L. Ramiller, "Selective Low Pressure Chemical Vapor Deposition of Tungsten," *Journal of the Electrochemical Society: Solid–State Science and Technology*, vol. 131, pp. 1427–1433, Jun. 1984.

(List continued on next page.)

*Primary Examiner*—William A. Powell
(74) *Attorney, Agent, or Firm*—John P. Hohimer

(57) ABSTRACT

A process is disclosed whereby a 5–50-nanometer-thick conformal tungsten coating can be formed over exposed semiconductor surfaces (e.g. silicon, germanium or silicon carbide) within a microelectromechanical (MEM) device for improved wear resistance and reliability. The tungsten coating is formed after cleaning the semiconductor surfaces to remove any organic material and oxide film from the surface. A final in situ cleaning step is performed by heating a substrate containing the MEM device to a temperature in the range of 200–600 ° C. in the presence of gaseous nitrogen trifluoride ($NF_3$). The tungsten coating can then be formed by a chemical reaction between the semiconductor surfaces and tungsten hexafluoride ($WF_6$) at an elevated temperature, preferably about 450° C. The tungsten deposition process is self-limiting and covers all exposed semiconductor surfaces including surfaces in close contact. The present invention can be applied to many different types of MEM devices including microrelays, micromirrors and microengines. Additionally, the tungsten wear-resistant coating of the present invention can be used to enhance the hardness, wear resistance, electrical conductivity, optical reflectivity and chemical inertness of one or more semiconductor surfaces within a MEM device.

59 Claims, 7 Drawing Sheets

OTHER PUBLICATIONS

M.L. Green and R.A. Levy, "Structure of Selective Low Pressure Chemically Vapor–Deposited Films of Tungsten," *Journal of the Electrochemical Society: Solid–State Science and Technology*, vol. 132, pp. 1243–1250, May 1985.

Ph. Lami and Y. Pauleau, "Evaluation of the Selective Tungsten Deposition Process for VLSI Circuit Applications," *Journal of the Electrochemical Society: Solid–State Science and Technology*, vol. 135, pp. 980–984, Apr. 1988.

C.R. Kleijn, C.J. Hoogendoorn, A. Hasper, J. Holleman and J. Middelhoek, "Transport Phenomena in Tungsten LPCVD in a Single–Wafer Reactor," *Journal of the Electrochemical Society*, vol. 138, pp. 509–517, Feb. 1991.

D.R. Bradbury, J.E. Turner, K. Nauka and K.Y. Chiu, "Selective CVD Tungsten as an Alternative to Blanket Tungsten for Submicron Plug Applications on VLSI Circuits," *Proceedings of the IEEE International Electron Devices Meeting*, pp. 10.3.1–10.3.4, 1991.

M. Sekine, Y. Kakuhara, K. Yamazaki and Y. Murao, "Si Reduction Reaction Mechanism of Selective W–CVD," *Materials Research Society Conference Proceedings ULSI-VII*, pp. 255–261, 1992.

A. Kepten, A. Reisman, M. Ray, P.L. Smith, D. Temple and F. Tapp, "Studies of the Possible Reaction of $WF_6$ with $SiO_2$ and $Si_3N_4$ at Several Temperatures," *Journal of the Electrochemical Society*, vol. 139, pp. 2331–2337, Aug. 1992.

J.J. Hsieh, "Influence of Surface–Activated Reaction Kinetics on Low–Pressure Chemical Vapor Deposition Conformality Over Micro Features," *Journal of Vacuum Science and Technology A*, vol. 11, pp 78–86, Jan./Feb. 1993.

W. Gruenewald, S.E. Schulz, B. Hintze and T. Gessner, "Interface Reactions between CVD and PVD Tungsten and Aluminum," *Applied Surface Science*, vol. 73, pp. 290–294, 1993.

W.–K. Yeh, M.–C. Chen and M.–S. Lin, "Effect of Surface Pretreatment on Submicron Contact Hole on Selective Tungsten Chemical Vapor Deposition," *Journal of Vacuum Science and Technology B*, vol. 14, pp. 167–173, Jan./Feb. 1996.

W.–K. Yeh, M.–C. Chen, P.J. Wang, L.–M. Liu and M.–S. Lin, "Deposition Properties of Selective Tungsten Chemical Vapor Deposition," *Materials Chemistry and Physics*, vol. 45, pp. 284–287, 1996.

* cited by examiner

TUNGSTEN COATING FOR IMPROVED WEAR RESISTANCE AND RELIABILITY OF MICROELECTROMECHANICAL DEVICES

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates generally to microelectromechanical (MEM) devices, and more particularly to a process for coating semiconductor surfaces of MEM devices with tungsten for improved wear resistance and reliability.

BACKGROUND OF THE INVENTION

Microelectromechanical (MEM) devices can be formed by bulk or surface micromachining processes. In bulk micromachining, a monocrystalline substrate is photolithographically patterned and etched to form a particular MEM device. In surface micromachining, a plurality of layers of polycrystalline silicon (also termed polysilicon) and a sacrificial material such as silicon dioxide or a silicate glass are alternately deposited and photolithographically patterned to form a MEM device. Up to three or four layers or more of structural polysilicon can be used to form surface micromachined MEM devices which can include numerous interconnected moveable elements (e.g. gears, wheels, carriages, linkages, hinges, ratchet pawls etc.,) with a plurality of contacting surfaces that are subject to wear upon repeated operation.

Wear has been identified as a significant failure mechanism and reliability issue for MEM devices, especially for load-bearing surfaces. One prior approach for reducing wear in MEM devices is based on the deposition of a thin layer of a low-friction polymeric coating on contacting surfaces of MEM devices (e.g. a polytetrafluoroethylene coating deposited by plasma-enhanced chemical vapor deposition, or a polymer deposited from a wet chemical solution). Such polymeric coatings are relatively soft so that wear is reduced simply by decreasing the coefficient of friction between the coated contacting surfaces. The long-term behavior of MEM devices having low-friction polymeric coatings is presently unknown, especially when the MEM devices are operated in vacuum environments (e.g. in space or in an evacuated package).

Another approach for reducing wear in MEM devices is based on the substitution of diamond or silicon carbide for polysilicon in order to provide an intrinsically hard material for forming the MEM devices. This approach is disadvantageous in that it deviates from conventional integrated circuit (IC) processing technology and tool sets which have traditionally been leveraged for use in surface micromachining and which allow integration of conventional integrated circuitry with MEM devices, sensors, optical devices etc., on the same substrate with no assembly required. Additionally, the use of diamond or silicon carbide for forming MEM devices can be problematic for process integration with ICs formed on the same substrate as the MEM devices.

What is needed is a hard coating for contacting or rubbing surfaces in MEM devices that is compatible with conventional IC process technology in terms of materials, film deposition equipment and process integration techniques.

An advantage of the present invention is that a thin conformal coating of tungsten can be formed over one or more semiconductor surfaces of a MEM device in a manner that is compatible with conventional IC process technology.

A further advantage of the present invention is that the conformal tungsten coating can be formed over the semiconductor surfaces within a MEM device after an etch release step whereby a sacrificial material used to surrounding elements of the MEM device during build-up of the device structure is removed, at least in part. The conformal tungsten coating can be formed on all exposed semiconductor surfaces of the released elements in a single process step. Furthermore, the tungsten coating can penetrate laterally between a pair of closely-spaced or contacting surfaces to coat those surfaces comprising the semiconductor material, while not coating other surfaces formed from non-semiconductor materials (e.g. dielectric materials such as silicon dioxide, silicon nitride or silicate glasses).

Another advantage of the present invention is that the ability of the conformal tungsten coating to be formed between contacting surfaces in a MEM device can be used to free elements of the MEM device suffering from stiction (i.e. unintentional adhesion to adjacent surfaces) after an etch release process step.

Yet another advantage of the present invention is that the conformal tungsten coating can be formed over semiconductor surfaces of an element of a MEM device without increasing the overall dimensions of that element.

A further advantage of the present invention is that the conformal tungsten coating provides a substantial improvement in the wear resistance and reliability of a MEM device.

Still another advantage of the present invention is that the conformal tungsten coating can be formed to a predetermined thickness of generally 5–50 nanometers by a self-limiting process which automatically terminates to prevent the formation of an excessively-thick tungsten coating.

A further advantage of the present invention is that the conformal tungsten coating can be formed at a temperature below about 600° C. for compatibility with standard integrated circuit (IC) processes, including the use of aluminum or an aluminum alloy as an interconnect metallization.

Yet another advantage of the present invention is that the conformal tungsten coating can improve the electrical conductivity or optical reflectivity of semiconductor elements within a MEM device.

Still another advantage of the present invention is that a wear-resistant tungsten coating can be formed on many different types of Group IV semiconductor surfaces including silicon, germanium, silicon-germanium alloys and silicon carbide. The present invention is further applicable to forming a tungsten coating on III–V semiconductors such as gallium arsenide.

These and other advantages of the present invention will become evident to those skilled in the art.

SUMMARY OF THE INVENTION

The present invention relates to a wear-resistant coating formed on at least one semiconductor surface of a moveable member in a microelectromechanical (MEM) device, comprising a 5–50-nanometer-thick conformal coating of tungsten. The semiconductor surface can comprise, for example, silicon or germanium. The moveable member can comprise, for example, a rotary member (e.g. a gear) which is rotatable about an angle of 360° (i.e. making one or more complete revolutions).

The present invention further relates to a wear-resistant coating formed on a moveable member (e.g. a rotary member such as a gear) in a MEM device by chemically reacting gaseous tungsten hexafluoride ($WF_6$) with at least one exposed semiconductor surface (e.g. comprising silicon, germanium or a combination thereof) of the moveable member at an elevated temperature in the range of 200 to 600° C. for sufficient time to form a 5–50-nanometer-thick conformal coating of tungsten over the exposed semiconductor surface.

The present invention also relates to a method for forming a tungsten coating on a semiconductor surface within a MEM device, comprising steps for cleaning the semiconductor surface in an oxidizing ambient and thereby substantially removing any organic material from the surface; cleaning the semiconductor surface with a fluid comprising hydrofluoric acid (HF) thereby substantially removing any oxide film from the surface; cleaning the semiconductor surface by heating the surface to a temperature in the range of 200–600° C. in the presence of gaseous nitrogen trifluoride ($NF_3$); and heating the semiconductor surface to a temperature in the range of 200–600° C. in the presence of gaseous tungsten hexafluoride ($WF_6$) and thereby forming the tungsten coating by a chemical reaction of the semiconductor surface with the gaseous tungsten hexafluoride. The semiconductor surface preferably comprises monocrystalline or polycrystalline silicon. However, in other embodiments of the present invention, the semiconductor surface can comprise germanium, a silicon-germanium alloy, silicon carbide or even a III–V compound semiconductor such as gallium arsenide.

This method of the present invention is a self-limiting process that allows the formation of a conformal tungsten coating with a layer thickness in the range of generally 5–50 nanometers on one or more semiconductor surfaces of the MEM device. Once the tungsten coating has become sufficiently thick (e.g. 5–50 nm) so that access of the $WF_6$ to the semiconductor surface is precluded, the reaction between the $WF_6$ and the semiconductor surface substantially terminates. Additionally, the method of the present invention produces a conformal tungsten coating that is free of pinholes.

The step for cleaning the semiconductor surface in the oxidizing ambient can comprise exposing the semiconductor surface to an oxygen plasma, or alternately to a cleaning solution comprising hydrogen peroxide ($H_2O_2$). The hydrogen peroxide cleaning solution further preferably includes sulfuric acid (e.g. from 5:1 $H_2SO_4:H_2O_2$ to 10:1 $H_2SO_4:H_2O_2$), with the cleaning solution being heated to a temperature in the range of preferably 60–130° C. The step for cleaning the semiconductor surface in the oxidizing ambient is generally carried out for a time duration in the range of 0.5–10 minutes.

The step for cleaning the silicon surfaces with the fluid comprising hydrofluoric acid can comprise cleaning the semiconductor surface with a buffered oxide etchant (e.g. a mixture of 6:1 of $NH_4OH:HF$) for a time duration in the range of 0.5–10 minutes. Alternately, the step for cleaning the silicon surfaces with the fluid comprising hydrofluoric acid can comprise cleaning the semiconductor surface with a mixture of one to one hundred parts of water to one part of hydrofluoric acid for the same time duration range cited above. Finally, in some embodiments of the present invention, the step for cleaning the silicon surfaces with the fluid comprising hydrofluoric acid can comprise cleaning the semiconductor surface with gaseous HF (i.e. HF vapor).

The step for cleaning the semiconductor surface by heating the surface to a temperature in the range of 200–600° C. in the presence of gaseous nitrogen trifluoride is preferably performed for a time duration of about ten minutes or less, with the temperature preferably being about 450° C.

The step for heating the semiconductor surface to a temperature in the range of 200–600° C. in the presence of gaseous tungsten hexafluoride ($WF_6$) and thereby forming the tungsten coating by a chemical reaction of the semiconductor surface with the gaseous tungsten hexafluoride generally proceeds for a time duration in the range of 0.5–20 minutes, with the temperature preferably being about 450° C.

The present invention further relates to a method for forming a wear-resistant coating on a semiconductor surface within a microelectromechanical (MEM) device, comprising steps for cleaning the semiconductor surface; and exposing the semiconductor surface to tungsten hexafluoride ($WF_6$) at an elevated temperature, thereby chemically reacting the tungsten hexafluoride with the semiconductor surface and forming a conformal tungsten coating with a layer thickness in the range of 5–50 nanometers over the semiconductor surface.

The semiconductor surface can comprise a semiconductor selected from the group consisting of silicon, germanium, silicon-germanium and silicon carbide (i.e. Group IV elements in the periodic table, or combinations thereof). A silicon semiconductor surface can further comprise either monocrystalline silicon or polycrystalline silicon (also termed polysilicon).

The step for cleaning the semiconductor surface comprises substantially removing any organic material from the semiconductor surface by exposing the semiconductor surface to an oxidizing ambient (e.g. an oxygen plasma, or a cleaning solution comprising hydrogen peroxide and also preferably further comprising sulfuric acid in the ratio of 5:1 $H_2SO_4:H_2O_2$ to 10:1 $H_2SO_4:H_2O_2$ at a temperature range of 60–130° C.) for a time duration in the range of 0.5–10 minutes. The step for cleaning the semiconductor surface preferably further comprises a step for substantially removing any oxide film from the semiconductor surface using a fluid comprising hydrofluoric acid (e.g. an aqueous HF solution, a buffered oxide etchant including a mixture of HF and ammonium hydroxide, or gaseous HF). Finally, the step for cleaning the semiconductor surface preferably further comprises a step for heating the semiconductor surface to a temperature in the range of 200–600° C. and preferably 450° C. and then exposing the heated semiconductor surface to gaseous nitrogen trifluoride ($NF_3$) for a time duration of about ten minutes or less.

Once the semiconductor surface has been cleaned, the semiconductor surface can be exposed to gaseous tungsten hexafluoride ($WF_6$) at a temperature in the range of 200–600° C. and preferably about 450° C. for a time duration in the range of 0.5–20 minutes to produce the conformal tungsten coating having a layer thickness in the range of 5–50 nanometers.

Finally, the present invention relates to a method for forming a MEM device having improved wear resistance, comprising steps for fabricating the MEM device by depositing and patterning a plurality of semiconductor layers and a plurality of layers of a sacrificial material; releasing the MEM device for operation by removing at least a part of the layers of the sacrificial material by etching; cleaning the MEM device to substantially remove any organic and oxide material from exposed surfaces of the semiconductor layers; and forming a conformal tungsten coating over the exposed surfaces of the semiconductor layers in the MEM device by reacting the exposed surfaces of the semiconductor layers with gaseous tungsten hexafluoride ($WF_6$) at an elevated temperature.

The step for fabricating the MEM device by depositing and patterning the semiconductor layers together with layers of the sacrificial material is well-known to the art of surface micromachining and need not be reiterated herein in great detail. Furthermore, the step for releasing the MEM device by removing at least a part of the layers of sacrificial material by etching is also well-known to the art of micromachining so that this step need not be reiterated herein in great detail.

According to this embodiment of the present invention for forming a MEM device with improved wear resistance, the step for cleaning the MEM device after release comprises steps for removing any organic material from the exposed surfaces of the semiconductor layers by cleaning the exposed surfaces of the layers in an oxidizing ambient; removing any oxide film from the exposed surfaces of the semiconductor layers by etching the exposed surfaces of the semiconductor layers with a fluid comprising HF; and heating the semiconductor layers to a temperature in the range of 200–600° C. (and preferably 450° C.) in the presence of gaseous $NF_3$. According to this embodiment of the present invention, the semiconductor layers preferably comprise silicon, germanium or silicon carbide.

The chemical reaction between the exposed surface of the semiconductor layers and the $WF_6$ is generally carried out at a temperature in the range of 200–600°C. and preferably at about 450° C. with the reaction generally proceeding for a time duration in the range of generally 0.5–20 minutes to produce a conformal tungsten coating having a layer thickness in the range of 5–50 nanometers.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
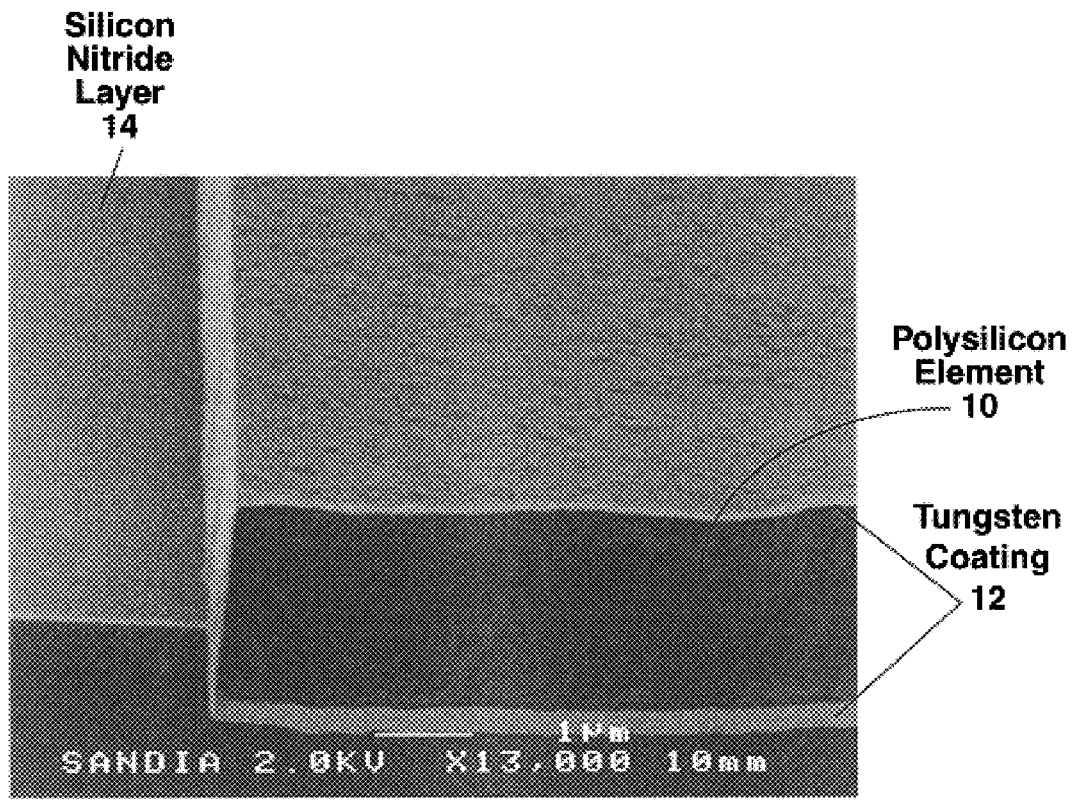
FIG. 1 shows a scanning electron microscope (SEM) image of an element in a MEM device to illustrate the ability of the present invention to form a conformal tungsten coating on a plurality of exposed semiconductor surfaces in the element of the MEM device.

Referring to FIG. 1, there is shown a scanning electron microscope (SEM) image of a portion of a polysilicon element 10 in a MEM device that has been overcoated with a wear-resistant tungsten coating 12 formed according to the present invention. In the example of FIG. 1, the polysilicon element 10 is a cantilevered beam formed by conventional surface micromachining processes that are well-known in the art and need not be reiterated herein in great detail. After formation and release of the MEM device and cleaning of the exposed polysilicon surfaces therein, the wear-resistant tungsten coating 12 was formed over the cantilevered beam 10 using a self-limiting process in which each exposed polysilicon surface of the cantilevered beam 10 chemically reacts with tungsten hexafluoride ($WF_6$) at an elevated temperature to form the tungsten coating 12 which completely covers each exposed polysilicon surface of the cantilevered beam 10.

To distinguish between the polysilicon material and the tungsten coating 12, the cantilevered beam 10 was sectioned by mechanical cleaving, and subsequently selectively etched for five seconds in a selective wet etchant comprising a mixture of one part hydrofluoric acid (HF) and fifty parts nitric acid ($HNO_3$). This selective wet etchant recessed the polysilicon while not substantially affecting the tungsten coating 12 which is chemically resistant to attack by the wet etchant. In the example of FIG. 1, the tungsten coating 12 is about 10 nanometers thick.

Also shown in FIG. 1 is an underlying layer 14 of silicon nitride which was blanket deposited over a supporting monocrystalline silicon substrate (not shown). The silicon nitride layer 14 is not coated with tungsten since the process of the present invention for forming the tungsten coating 12 is selective to certain Group IV elements in the periodic table or combinations thereof (e.g. silicon, germanium, silicon carbide and carbon in the form of diamond). Specifically, no chemical reaction occurs between such materials as silicon nitride, silicon dioxide and silicate glass so that these materials are free from any tungsten coating after processing according to the present invention. Similarly, any polysilicon surface that is protected by a layer of silicon nitride, silicon dioxide or silicate glass will not be coated with tungsten after processing since the polysilicon cannot come into contact with the $WF_6$ for a reduction reaction to occur to produce metallic tungsten.

Figure 2:
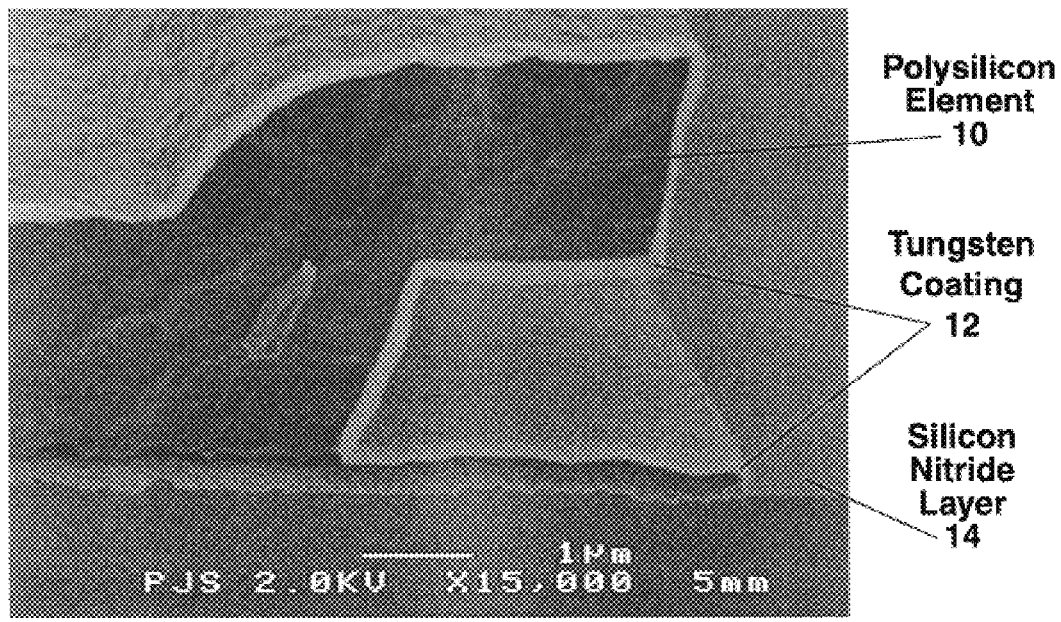
FIG. 2 shows an SEM image of another element in a MEM device to illustrate the ability of the present invention to form a conformal tungsten coating over this element which has a complicated geometry.

FIG. 2 illustrates another example of a polysilicon element in a MEM device that is coated with the wear-resistant tungsten coating of the present invention. In FIG. 2, the tungsten coating 12 is formed conformally over each exposed surface of a polysilicon element 10 which has a complicated geometry including inside and outside corners. Mechanical cleaving was used to cross-section the polysilicon element 10 in FIG. 2 which was subsequently etched as described previously to distinguish between the polysilicon and the tungsten coating 12. From FIG. 2, it can be seen that the tungsten coating 12 of the present invention provides excellent step coverage and layer uniformity.

The tungsten coating of the present invention also provides a high-density hard coating that enhances the wear resistance for semiconductor surfaces of MEM elements which come into mechanical contact with each other. Typical MEM elements can be, for example, about 50–500 $\mu$m in length, 5–500 $\mu$m in width, 0.5–2 $\mu$m thick and supported 0.5–2 $\mu$m above a substrate. Without a hard coating of tungsten of about 5–50 nanometers thickness, such contacting semiconductor surfaces which are generally not lubricated in MEM devices are subject to wear which can result in the generation of wear debris (e.g. polysilicon particles abraded from polysilicon surfaces) which can detrimentally affect the reliability of the MEM devices.

In conventional MEM devices, wear is especially pronounced for rotary members operating at high speed or for a large number of revolutions. For example, a surface micromachined MEM electrostatic microengine as disclosed in U.S. Pat. No. 5,631,514 to Garcia has been used to rotate a drive gear similar to that shown in FIG. 3A at speeds as high as 600,000 revolutions per minute (rpm). This MEM microengine operates at high speed, but produces a relatively low output torque so that the MEM microengine is generally used to drive a gear train (not shown) to increase the torque for use in microelectromechanical applications. However, the high-speed operation of the drive gear about a hub and an associated pin joint used to couple mechanical energy from a pair of electrostatic comb actuators to the drive gear via a linkage can result in wear which limits the reliability and useful lifetime of the device to generally only up to a few million cycles (i.e. rotations of the drive gear). Over time, the various rubbing polysilicon surfaces of the drive gear, hub and pin joint produce wear debris (i.e. polysilicon particles generated by frictional contact of the rubbing surfaces) which can further act abrasively to shorten the lifetime of the MEM microengine, or to clog the rubbing surfaces and thereby cause a seizure of the moving parts.

Such wear and reliability problems can be greatly alleviated according to the present invention by providing a conformal tungsten wear-resistant coating 12 over each exposed polysilicon surface within the MEM microengine, and especially over contacting or rubbing surfaces. Initial fabrication of the MEM microengine can be performed using conventional surface micromachining processes as detailed in U.S. Pat. No. 5,631,514 which is incorporated herein by reference.

With surface micromachining, the MEM microengine (or any other type of MEM device for which the present invention can be used) is built up layer by layer using a series of steps for depositing and patterning a plurality of semiconductor layers and layers of a sacrificial material (e.g. silicon dioxide or a silicate glass such as tetraethylorthosilicate) to define various elements of the MEM microengine including a pair of electrostatic comb actuators oriented and driven orthogonal to each other, a drive gear supported on a hub, and a linkage connecting the pair of electrostatic comb actuators to the drive gear via a pin joint. Each polysilicon layer (generally about 0.5–2 $\mu$m thick) used to form the MEM microengine can be deposited, for example, by low-pressure chemical vapor deposition (LPCVD) at a temperature of about 580° C. Each sacrificial layer can be similarly deposited by LPCVD, or alternately by plasma-enhanced chemical vapor deposition (PECVD). Annealing of the various polysilicon layers (e.g. at about 1100° C. for several hours) can be used to relieve any stress therein. After the deposition of a particular polysilicon layer or a sacrificial layer, that layer can be patterned by providing a photolithographic mask over the layer and using an anisotropic etching process such as reactive ion etching to define particular features in that layer. Chemical mechanical polishing as disclosed, for example, in U.S. Pat. No. 5,804,084, which is incorporated herein by reference, can be used to planarize the layers as needed to prevent mechanical interferences with adjacent layers and to improve the topography of the device structure. After the device structure of the MEM device is completed, it can be released for movement by removing the sacrificial material in part or entirely by exposure to a selective wet etchant comprising HF which does not substantially attack the polysilicon layers. If electronic circuitry is formed on the semiconductor substrate adjacent to the MEM device for operation thereof, such circuitry can be protected during the etch release step by blanket depositing a protection layer (e.g. photoresist, silicon nitride or tungsten) over the electronic circuitry. The protection layer can be removed after the etch release step.

Once the MEM device has been released, a wear-resistant coating 12 of tungsten can be formed over all exposed semiconductor surfaces in the device using the process described in detail below. An exposed semiconductor surface of a MEM device is defined herein as a semiconductor surface that is not covered by a layer of a material (e.g. silicon nitride or silicon dioxide) which is not chemically reactive with tungsten hexafluoride. Although described below in terms of a surface-micromachined MEM device, those skilled in the art will understand that the present invention is also applicable to bulk-micromachined MEM devices (which are generally formed by photolithographically patterning and etching a bulk layer deposited on a monocrystalline substrate or the substrate itself).

To initially prepare the semiconductor surfaces (e.g. comprising polysilicon) for formation of the tungsten wear-resistant coating 12 a series of cleaning steps are used. Any organic material present on the semiconductor surfaces must be removed by cleaning the surfaces. This can be done by exposing the semiconductor surfaces to an oxidizing ambient for a time period of 0.5 to 10 minutes. The oxidizing ambient can comprise a cleaning solution comprising hydrogen peroxide ($H_2O_2$). A particular cleaning solution useful for practice of the present invention is a 5:1 solution of sulfuric acid ($H_2SO_4$):$H_2O_2$ at a temperature of 95° C. (a so-called "Piranha" cleaning solution). A substrate containing a plurality of the released MEM devices to be cleaned can be immersed in the 5:1 $H_2SO_4$:$H_2O_2$ solution for about 5 minutes for removing any organic material from the semiconductor surfaces. Other peroxide-based cleaning solutions can be used according to the present invention. For example, cleaning solutions comprising a mixture of $H_2SO_4$ and $H_2O_2$ in the range of 5:1 $H_2SO_4$:$H_2O_2$ to 10:1

$H_2SO_4$:$H_2O_2$ temperature in the range of 60–130° C. can be used to remove any organic material from the semiconductor surfaces prior to formation of the tungsten wear-resistant coating 12. Alternately, exposure of the semiconductor surfaces to a conventional oxygen plasma for up to a few minutes (e.g. 0.5–10 minutes) will remove any organic material from the semiconductor surfaces. The use of oxygen plasmas is well-known in the art for removing photoresist residue from integrated circuits (i.e. a so-called "descum" process step).

Once any organic material has been removed from the semiconductor surfaces in the MEM device, the semiconductor surfaces are further cleaned to substantially remove any oxide film (e.g. a native oxide film comprising silicon dioxide or germanium dioxide) from the surface. This oxide cleaning step is important since a native oxide film, if sufficiently thick (e.g. >2 nm), can slow down or prevent a chemical reaction between the semiconductor (e.g. silicon or germanium) surface and the $WF_6$ which is required to form the tungsten coating 12.

The oxide cleaning step can be performed by exposing the semiconductor surfaces to a fluid comprising hydrofluoric acid (HF) in the form of a gas (i.e. a vapor) or a liquid solution (e.g. a solution of one to one hundred parts HF to one hundred parts water; or a buffered oxide etchant comprising one part HF to about six to thirty parts ammonium hydroxide) for a time duration of generally 0.5–10 minutes. As an example, any native oxide film present on silicon surfaces in a MEM device can be removed by dipping a substrate containing the MEM device after release into a 1:100 solution of HF:$H_2O$ for about two minutes. As another example, exposed silicon surfaces in a MEM device can be substantially cleaned of any native oxide film by dipping the substrate containing the MEM device into a solution comprising one part of a buffered oxide etchant to six to thirty parts of water for about the same time duration. Alternately, the oxide cleaning step can be performed by exposing the semiconductor surfaces to a plasma (e.g. containing hydrogen).

It will be understood by those skilled in the art, that immediately after the above etching step, a thin film of native oxide will begin to re-form over the semiconductor surfaces once the surfaces are dried and exposed to air. In some cases, such a native oxide film of a predetermined thickness (e.g. 1–2 nm) can be beneficial (e.g. for limiting diffusion of the semiconductor into the tungsten coating 12). However, if the native oxide film is allowed to grow too thick, it can prevent the subsequent formation of a uniform coating of tungsten over the semiconductor surfaces since it can prevent the tungsten hexafluoride from coming into contact with the semiconductor surfaces or limit an area of contact therewith. Thus, it is generally important to perform the oxide cleaning step immediately prior to loading the substrate into a vacuum chamber (e.g. an evacuated sample chamber of a conventional LPCVD system) wherein a subsequent in situ $NF_3$ cleaning step is performed. This minimizes the thickness of any native oxide film that is present on the cleaned semiconductor surfaces for the subsequent deposition of the tungsten coating 12 thereon.

A vapor-phase cleaning step is performed within the vacuum chamber by exposing the semiconductor surfaces to $NF_3$ at an elevated temperature for a time duration of about 10 minutes or less. This can be done by loading the substrate onto a heated stage in the LPCVD system and then heating the substrate containing the MEM device to a temperature within the range of 200–600° C., and preferably to about 450° C. A gaseous mixture of about 200 standard-cubic-centimeters-per-minute (sccm) of $NF_3$ in about 100–200 of an inert carrier gas (e.g. argon) is flowed through the LPCVD system at a total pressure of about 400 milliTorr. It should be noted that the $NF_3$ is used in gaseous form and not as a plasma to clean the semiconductor surfaces of the MEM device according to the present invention.

The gaseous $NF_3$ in contacting the heated semiconductor surfaces is believed to remove any residual surface contamination from the semiconductor surfaces since the $NF_3$ is a strong oxidizing agent. Additionally, exposure of the heated semiconductor surfaces to the $NF_3$ prepares the semiconductor surfaces (i.e. by fluorinating the surfaces) for the subsequent deposition of the tungsten coating 12 which can take place within the same LPCVD system. Eliminating the $NF_3$ cleaning step is generally detrimental since it leads to a non-uniform deposition of the tungsten coating 12 and to adhesion problems with the tungsten coating. The in situ $NF_3$ cleaning step does not substantially chemically attack oxide layers (e.g. silicon dioxide) or nitride layers in the MEM device. For example, a ten minute $NF_3$ clean performed on a silicon substrate blanketed by a 100-nm-thick thermal oxide layer resulted in a decrease in layer thickness of only about 0.1%.

After the above cleaning steps have been performed, the tungsten coating 12 can be formed over the cleaned semiconductor surfaces by a chemical reaction wherein the semiconductor surfaces react with tungsten hexafluoride ($WF_6$) at an elevated temperature within the range 200–600° C., and preferably about 450° C., for a time period in the range of 0.5–20 minutes, and preferably about 2–5 minutes. This chemical reaction produces metallic tungsten (W) which is conformally deposited as a coating 12 on the cleaned semiconductor surfaces. In the case of a silicon surface, the chemical reaction is of the form:

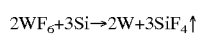

where the upward arrow in the equation indicates a gaseous by-product of the chemical reaction. A similar chemical reaction takes place for germanium (Ge), in which case Ge is substituted for Si at every instance in the above equation. In the case of semiconducting silicon carbide (SiC), the chemical reaction is expected to be:

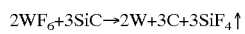

based on thermodynamics.

The chemical reaction responsible for the formation of the tungsten coating 12 on exposed semiconductor surfaces of the MEM device can be carried out in a conventional LPCVD system (e.g. a Genus, Inc., Model 8720 LPCVD system) which is also preferably used for the $NF_3$ cleaning step. The tungsten deposition can be performed, for example, by providing a continuous flow of 200 sccm of $WF_6$ and 100 sccm of an inert gas (e.g. argon) in the LPCVD system at an overall pressure of about 400 milliTorr.

Deposition of the tungsten coating 12 preferably occurs at a temperature which is sufficiently low to be compatible with the use of aluminum or an aluminum alloy as an interconnect metallization for the MEM device. Furthermore, the process for forming the tungsten coating 12 of the present invention is compatible with standard IC processes so that integrated circuitry (e.g. CMOS or bipolar circuitry) can be formed on the same substrate as the MEM device. The formation of such integrated circuitry preferably takes place before the MEM device is released so that the integrated circuitry can be covered with a protection layer during the etch release step, during the cleaning steps described previously, and during the step for forming the tungsten coating 12 on semiconductor surfaces of the MEM device.

The above reactions for the deposition of the tungsten coating 12 over the semiconductor surfaces of the MEM device are self limiting in that the semiconductor surface (e.g. Si) reacts with the $WF_6$ to form the tungsten coating 12 which is then deposited to blanket the semiconductor surface. For the chemical reaction to be sustained, additional $WF_6$ molecules must have access to the semiconductor surface; and this becomes increasingly difficult as the tungsten coating 12 builds up over the semiconductor surface thereby providing a barrier to prevent the $WF_6$ molecules from coming into contact with the semiconductor surface where the chemical reaction occurs. Thus, as the tungsten coating 12 builds up, the chemical reaction begins to slow down and eventually terminates. Complete termination of the chemical reaction occurs at a layer thickness (e.g. 5–50 nm) for which the tungsten coating 12 is sufficiently thick and free from pinholes so as to prevent diffusion or transport of the $WF_6$ to the semiconductor surface.

Additionally, formation of the tungsten coating 12 on the MEM device does not increase any dimensions of the elements of the MEM device since the semiconductor material (e.g. Si) used to form the exposed semiconductor surfaces of the MEM device is consumed by the chemical reaction and is converted into a gaseous by-product. In fact, about twice the volume of the semiconductor material (e.g. Si) is consumed by the chemical reaction with the $WF_6$ as compared to the volume of the tungsten coating 12 that is formed. This allows a pair of contacting semiconductor surfaces (e.g. polysilicon surfaces of a gear mounted on a hub, or a pair of meshed gears) to be coated with tungsten as the chemical reaction proceeds laterally inward between the contacting semiconductor surfaces, with the resulting chemical reaction removing more semiconductor material (e.g. Si) from the surfaces than is replaced with the deposited tungsten. As a result, as the chemical reaction proceeds laterally inward, a small gap is formed between the contacting semiconductor surfaces as each of these surfaces becomes coated with tungsten. This prevents the deposited tungsten coating 12 from bridging between the two semiconductor surfaces which would otherwise result in the two surfaces being fused together by the deposited tungsten coating 12.

Figure 3A:
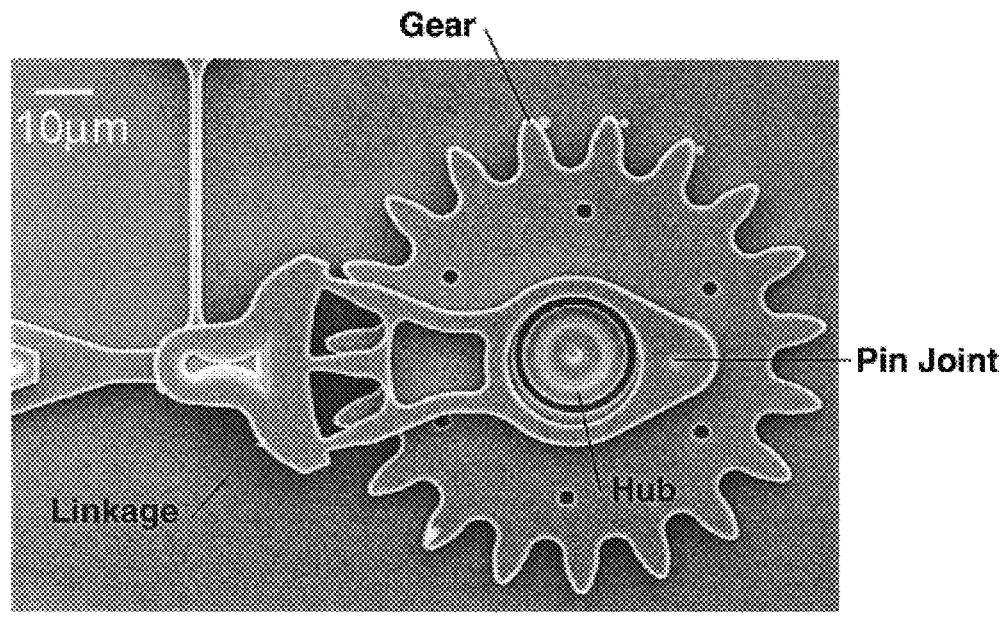
FIG. 3A shows an SEM image of a portion of a linkage and driving gear of a MEM microengine having a conformal tungsten coating formed thereon after operation for $2 \times 10^6$ cycles at an electrical drive frequency of 1720 Hz.
Figure 4A:
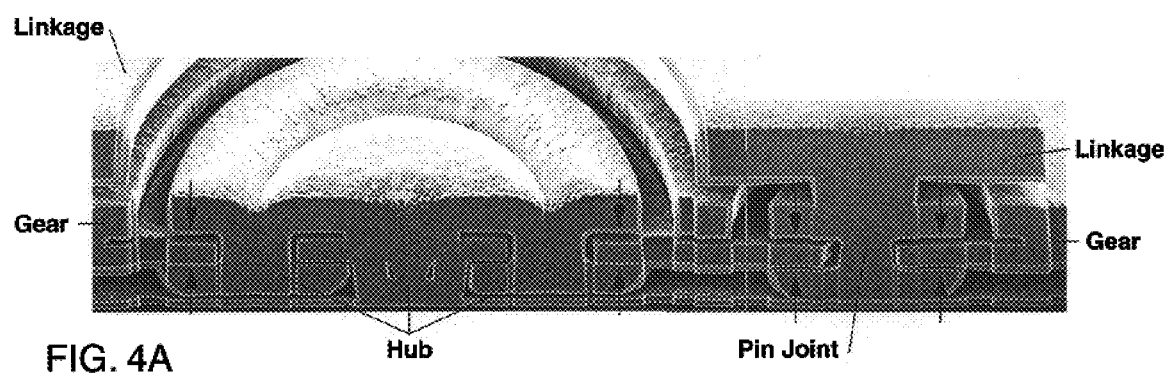
FIG. 4A shows an SEM image of a focused-ion-beam cross-section of the MEM device of FIG. 3A to indicate the locations of rubbing surfaces (indicated by the vertical arrows) about a hub and pin joint of the device, and to further show the improved wear resistance provided by the conformal tungsten coating of the present invention.

The ability of the present invention to form a conformal tungsten coating 12 between closely-spaced or contacting semiconductor surfaces can be seen in the example of FIG. 4A which shows an SEM image of a focused-ion-beam cross-section of the gear, hub and pin joint of FIG. 3A after operation for $2 \times 10^6$ cycles (each cycle is a complete rotation of the drive gear) at an electrical drive frequency of 1720 Hz. In FIG. 4A, the gaseous $WF_6$ has penetrated to react with all the exposed polysilicon surfaces in the MEM microengine of FIG. 3A including a plurality of closely-spaced rubbing surfaces which are indicated by the vertical arrows.

The reaction between the $WF_6$ and the polysilicon surfaces forms a thin (~10 nm) conformal coating 12 of tungsten over all the polysilicon surfaces while still allowing sliding contact between the various rubbing surfaces. In FIG. 4A, the conformal tungsten coating 12 appears as a thin white line, with a thicker coating overlying the tungsten coating being the result of a re-deposition of material sputtered from the MEM microengine during cross-sectioning with the focused ion beam. Thus, in FIG. 4A, each of the gear, hub and pin joint remain separate, distinct and moveable with respect to each other after formation of the conformal tungsten coating 12. This results in full functionality of the MEM device after fabrication of the tungsten coating 12 to provide for improved wear resistance of the MEM device.

The self-limiting nature of the chemical reaction responsible for the formation of the tungsten coating 12 has been verified by measuring the thickness of the tungsten coating 12 that is formed as a function of time for the chemical reaction with $WF_6$. These measurements were made using six inch diameter monocrystalline silicon wafers upon which a 200-nm-thick layer of polysilicon was blanket deposited at about 580° C. by LPCVD. The polysilicon surfaces of the silicon wafers were cleaned using the steps described previously, including the in situ $NF_3$ cleaning step. The silicon wafers were then heated in the vacuum chamber of the LPCVD system to 450° C.; and the polysilicon surfaces were chemically reacted with the WF6 for varying lengths of time in the range of 2–16 minutes. The layer thicknesses of the resulting tungsten coatings 12 were determined by Rutherford Back Scattering (RBS) measurements using 2.0 MeV helium ions. Table 1 summarizes the results of these measurements. From Table 1, it can be seen that the chemical reaction between the

TABLE 1

| W Deposition Time (minutes) | W (atoms/cm$^2$) | Layer Thickness of Tungsten Coating (nm) |
|---|---|---|
| 16 | 5.88 × 10$^{16}$ | 9.3 |
| 8 | 4.83 × 10$^{16}$ | 7.6 |
| 4 | 4.48 × 10$^{16}$ | 7.1 |
| 4 | 4.55 × 10$^{16}$ | 7.2 |
| 2 | 4.3 × 10$^{16}$ | 6.8 |

$WF_6$ and the polysilicon initially proceeds very rapidly and then slows down as the polysilicon surface becomes coated with tungsten.

The formation of the tungsten coating 12 on the semiconductor surfaces of the MEM device according to the present invention is extremely conformal as shown in the cross-section views of FIGS. 1, 2 and 4A. The excellent wear resistance provided by the conformal tungsten coating 12 can also be seen in FIGS. 3B and 4B which show portions of a MEM microengine similar to that of FIGS. 3A and 4A except that the device of FIGS. 3B and 4B has been operated for $1 \times 10^9$ cycles without any signs of failure at the same drive frequency as the device of FIGS. 3A and 4A. This corresponds to about one week of continuous operation of the MEM microengine.

Figure 3B:
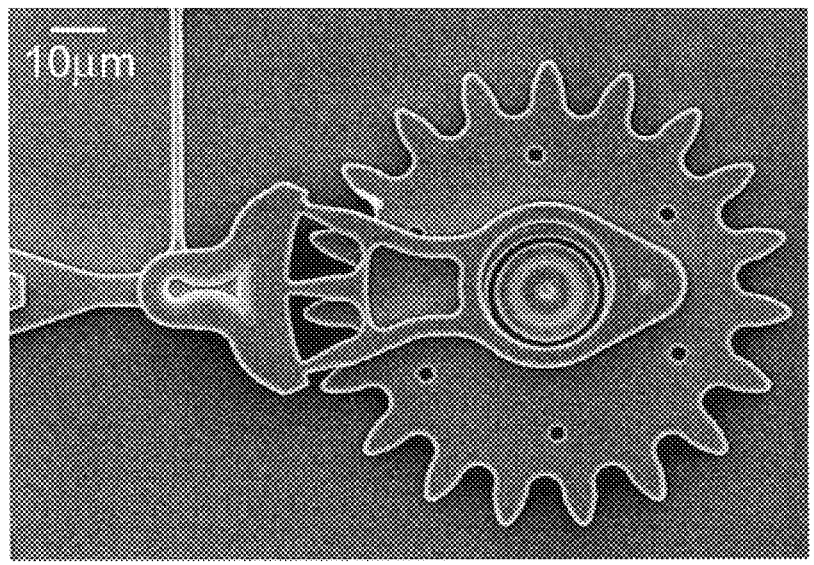
FIG. 3B shows an SEM image of the same portion of another MEM microengine with a conformal tungsten coating thereon after operation for $1 \times 10^9$ cycles at the same drive frequency as in FIG. 3A.
Figure 4B:
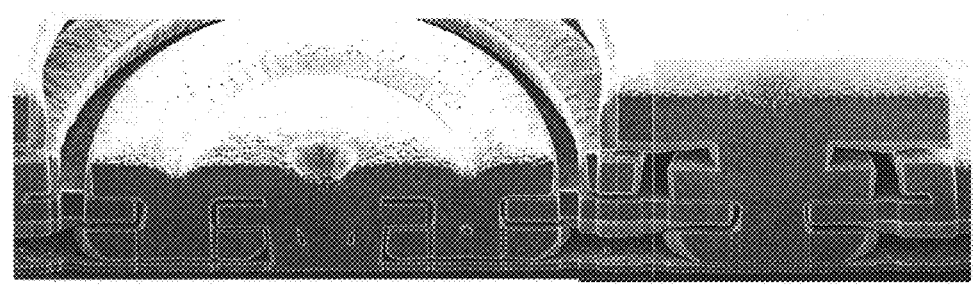
FIG. 4B shows an SEM image of a focused-ion-beam cross-section of the MEM device of FIG. 3B.
Figure 5:
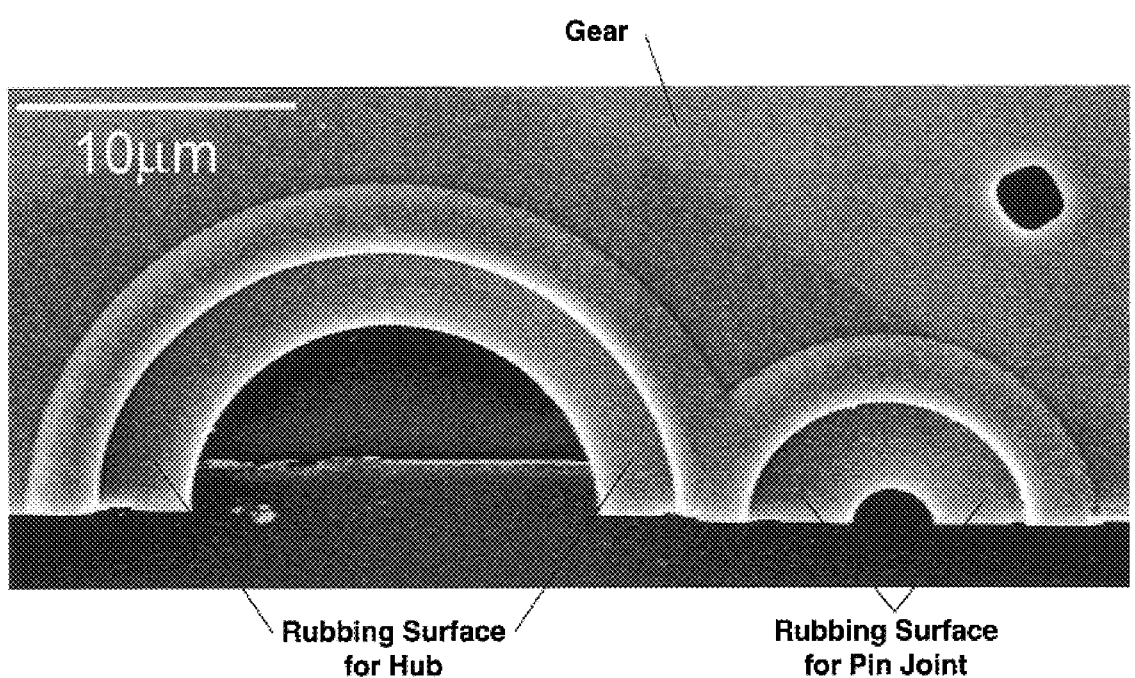
FIG. 5 shows an SEM image of the cross-sectioned device of FIG. 4B in plan view with the hub and pin joint removed to show the absence of any wear tracks at the rubbing surfaces for the hub and pin joint after $1 \times 10^9$ cycles of operation.

Neither of the MEM devices of FIGS. 3 and 4 had failed prior to their being analyzed for evidence of wear. Furthermore, the difference in wear between the device of FIGS. 3A and 4A and that of FIGS. 3B and 4B is insubstantial, with no evidence of wear debris for either device. Furthermore, after a prolonged period of operation, the device of FIGS. 3B and 4B shows no evidence of any wear tracks on the rubbing surfaces of the drive gear which are contacted by the hub and pin joint (see FIG. 5). Without the tungsten wear-resistant coating 12 of the present invention, the lifetime of the MEM microengine is reduced substantially to generally on the order of $10^6$ cycles of operation, with wear tracks and wear debris (in the form of microscopic polysilicon particles generated by the various rubbing surfaces) gradually appearing on the gear, hub and pin joint of the MEM microengine over the lifetime of the device.

Figure 6:
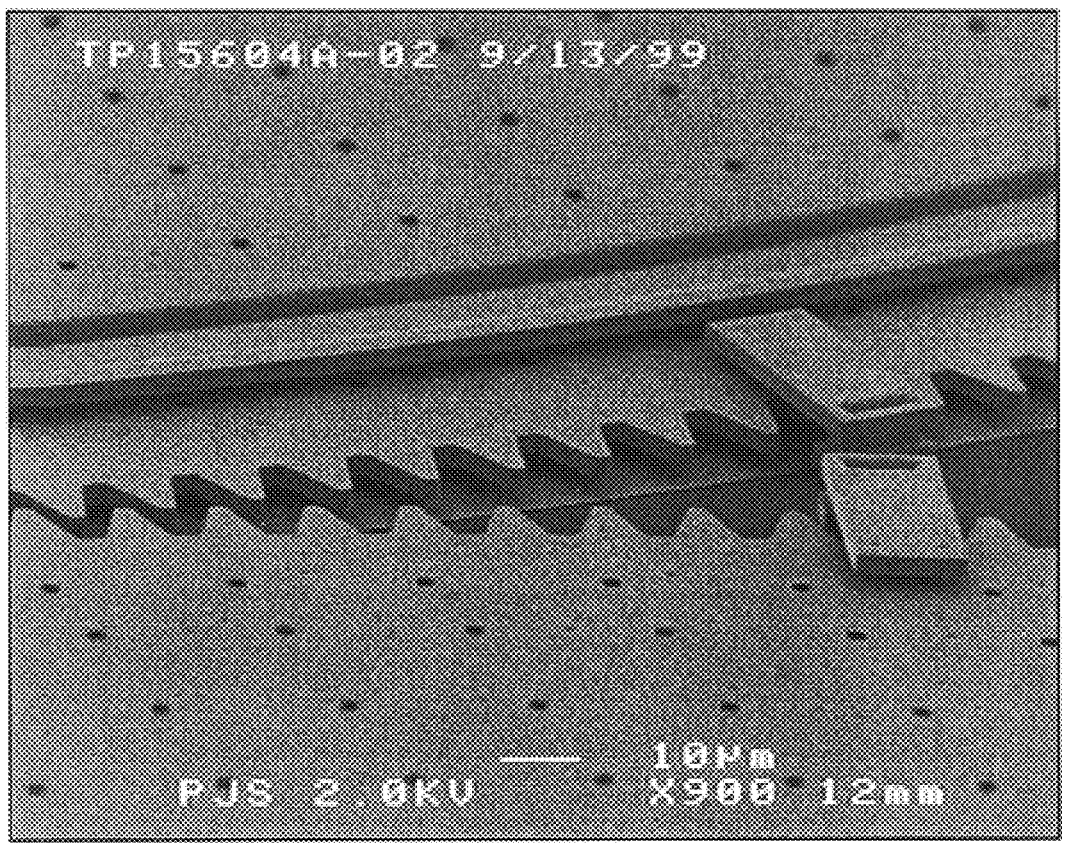
FIG. 6 shows an example of meshed gears coated with the tungsten coating of the present invention for improved wear resistance.

FIG. 6 shows an example of meshed gears coated with the tungsten coating 12 of the present invention to indicate the usefulness of the present invention for forming a wear-resistant tungsten coating over complicated MEM devices having a plurality of contacting surfaces. In FIG. 6, the conformal tungsten coating 12 of the present invention is formed over all surfaces of each meshed gear, including the enmeshed gear teeth. Additionally, the tungsten wear-resistant coating 12 is formed over a plurality of guides which overlie the gear teeth to limit vertical play in the gears, and on the hubs supporting each gear.

The present invention also has applications for eliminating adhesion (i.e. stiction) in MEM devices. Since MEM devices generally have a large surface area compared to their volume, these devices are particularly vulnerable to adhesion to the substrate or to adjacent structures during an etch release step, or during use especially in a moist environment. This adhesion phenomenon, which is termed "stiction", generally results when the MEM devices are dried after etching away a sacrificial material that is deposited to build up a semiconductor structure of the MEM devices as described previously. When the released MEM devices are removed from a wet etchant solution comprising HF which is used for dissolving away the sacrificial material to release the device for operation and subsequently washed and dried, the resulting capillary forces can act to pull elements of the MEM device together or toward the substrate whereon the MEM device is fabricated, thereby producing the stiction. Stiction, therefore, is a major factor in determining a production yield of operational MEM devices, and also in determining the reliability of MEM devices used in moist environments.

The conformal tungsten coating 12 of the present invention can also be used to reduce or eliminate stiction in MEM devices after fabrication and release. By coating a MEM device with tungsten after release, it is possible to free elements of the MEM device that are adhered to the substrate or to other elements since the chemical reaction responsible for the deposition of the tungsten coating 12 can proceed laterally underneath the adhered elements. This is possible since the chemical reaction consumes a larger thickness of the semiconductor material (e.g. Si) from which the surfaces of the elements are formed than is replaced by the deposition of the tungsten coating 12. The lateral undercutting of the tungsten deposition process of the present invention, which proceeds at a slower rate than the reaction for a completely exposed semiconductor surface as summarized in Table 1, continually exposes new semiconductor material as the chemical reaction moves laterally inward so that the reaction will eventually proceed until a tungsten coating 12 is formed completely over all exposed semiconductor surfaces of the MEM device. As the chemical reaction responsible for the deposition of tungsten moves laterally inward, it produces an enlarged gap between the element and the substrate or other element, thereby acting to counter the adhesion and to free the adhered element. Additionally, the electrical conductivity of the deposited tungsten coating 12 in being greater than that of the semiconductor surface of the adhered element, can further act to reduce or dissipate any electrical charge on the semiconductor surface which may be contributing to the stiction.

Figure 7:
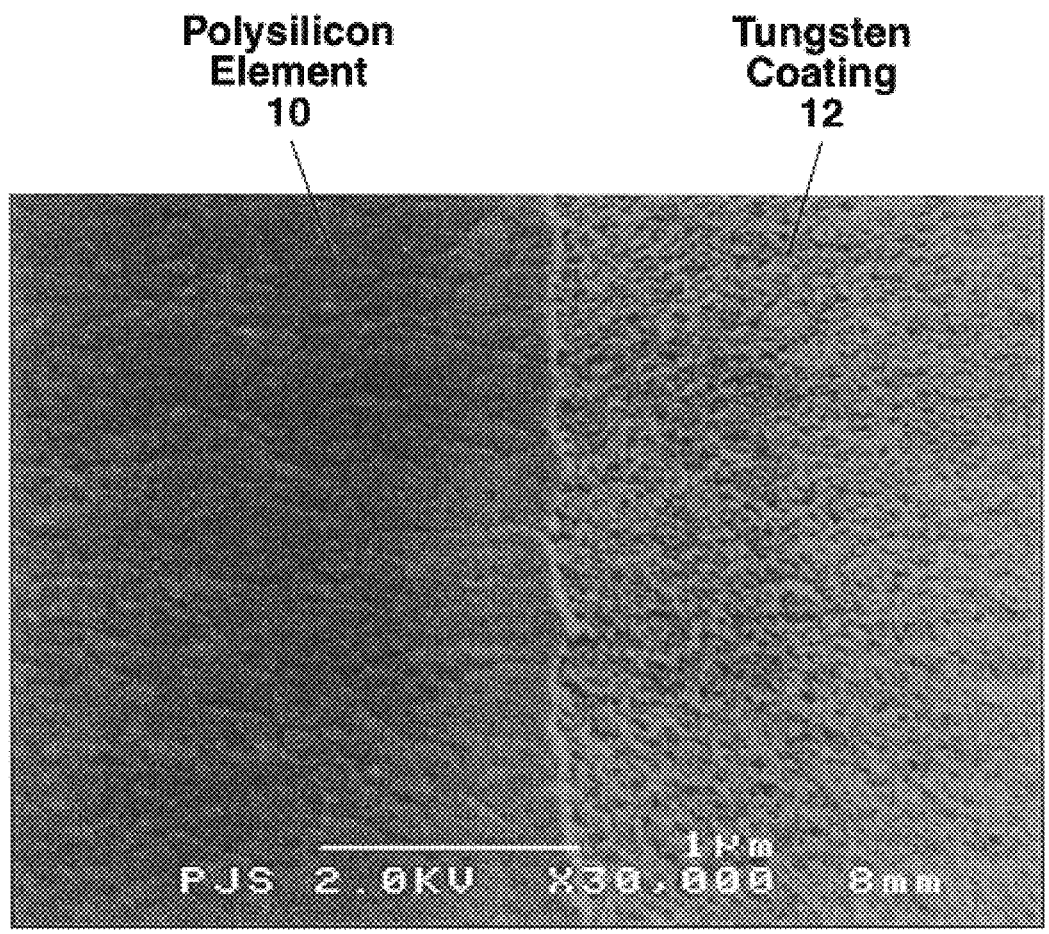
FIG. 7 shows an SEM image of a portion of the underside of a cantilevered beam which was adhered to the substrate after an etch release step to illustrate the ability of the tungsten coating of the present invention to penetrate laterally across an adhered semiconductor surface over time, and thereby release the adhered beam.

The process of the present invention for forming a tungsten coating 12 underneath adhered elements of a MEM device is illustrated in FIG. 7 which shows an SEM image of a portion of the underside of a cantilevered beam that was adhered to the substrate after an etch release step. The chemical reaction for depositing tungsten proceeded laterally from the right-hand side of FIG. 7. After a few minutes, the reaction was terminated and carbon tape was used to lift the cantilevered beam to examine the progress of the lateral undercutting process and to obtain the SEM image in FIG. 7. In FIG. 7 a sharp boundary exists between the tungsten coating 12 and the polysilicon element 10 (i.e. the cantilevered beam) indicating that the beam was tightly adhered to the substrate and that the tungsten deposition process proceeded inward from an outer edge of the cantilevered beam.

The present invention has application to many different types of MEM devices. For example, a conformal tungsten coating 12 can be applied over contacting semiconductor surfaces in a MEM relay (i.e. a microrelay) comprising one or more electrostatically moveable contact arms (e.g. cantilevered beams) for improved wear resistance and increased electrical conductivity. Additionally and importantly, the tungsten coating 12 provides a reduced contact resistance for the contact arms in a MEM relay since no oxide film forms upon tungsten surfaces of the contact arms. This is an improvement over semiconductor contact arms in which an oxide film can result in a relatively high contact resistance for the MEM relay.

As another example, the tungsten coating 12 of the present invention can be applied to an electrostatically moveable mirror (e.g. a tilting mirror also termed a "micromirror") to improve the optical reflectivity of a semiconductor surface therein (i.e. a mirror).

As yet another example, the tungsten coating 12 of the present invention can be applied to semiconductor surfaces of fixed or moveable elements (e.g. gears, hubs, pin joints, linkages, electrostatic comb actuators) in a MEM microengine for hardening and improved wear resistance. The tungsten coating 12 can be simultaneously applied to exposed surfaces of semiconductor layers deposited on a semiconductor substrate or to the substrate itself (e.g. a monocrystalline silicon substrate) to enhance electrical conductivity and to reduce electrical contact resistance. The tungsten coating 12 can be used, for example, to form a ground plane underneath the MEM microengine by coating a first-deposited polysilicon layer. The deposited tungsten coating 12 can also be applied over an exposed surface of a polysilicon layer used to form the MEM micromachine to define interconnection wiring (e.g. for operating the micromachine), or to reduce the resistivity and/or contact resistance of existing interconnection wiring formed in the polysilicon layer. This is possible since all exposed semiconductor surfaces within the MEM microengine after release will be coated with the deposited tungsten coating by the chemical reaction between the semiconductor and the $WF_6$.

Those skilled in the art will understand from the foregoing description that numerous other types of MEM devices including bulk micromachined devices (e.g. fabricated from monocrystalline silicon) can be improved by application of a conformal tungsten coating 12 according to the present invention. Such a tungsten coating 12 can be applied to many different types of elements of particular MEM devices including actuators, gears, wheels, stages, carriages, stops, guides, rails, linkages, hinges, joints, pins, ratchet pawls, cantilevered beams, dimples, electrical or mechanical contact arms and pads etc., for improved wear resistance. Each exposed semiconductor surface of the above-cited elements within one or more MEM devices formed on a substrate can be simultaneously coated with tungsten according to the present invention. Furthermore, the various properties (e.g. hardness, wear resistance, electrical conductivity, optical reflectivity, chemical inertness) of the tungsten coating 12 of the present invention can be exploited singly or in combination to form improved MEM devices.

Although the present invention has been described in terms of forming a hard tungsten coating on a MEM device for improved wear resistance, those skilled in the art will understand that the present invention is also applicable to the formation of other types of tungsten coatings over selected semiconductor surfaces or layers within MEM devices. For example, a porous silicon layer in a MEM chemical sensor can be converted, at least in part, into a porous tungsten layer or coating by reacting the porous silicon layer with tungsten hexafluoride at a temperature in the range of 200–600° C. for a predetermined time interval (e.g. 0.5–20 minutes) sufficient to convert part or all of the porous silicon into porous tungsten. If the chemical reaction with $WF_6$ is carried on immediately after forming the porous silicon in a vacuum chamber or inert atmosphere, no cleaning steps are generally needed since the semiconductor surfaces of the porous silicon will be free of any organic materials or oxide film. Alternately, the porous silicon can be cleaned prior to the chemical reaction with $WF_6$ using one or more of the cleaning steps described previously. Since the $WF_6$ freely permeates through the porous silicon to form the porous tungsten, a porous tungsten layer can be formed that is up to tens of microns thick. Such a porous tungsten coating can be used, for example, as a catalyst on the MEM chemical sensor (e.g. for use in sensing ammonia).

Once the tungsten coating 12 has been formed on semiconductor surfaces within a MEM device, additional process steps can be performed to further harden an outer surface of the tungsten coating 12 for even increased wear resistance. This can be done, for example, by exposing the MEM device after formation of the tungsten coating 12 to a nitrogen-containing plasma (e.g. using $N_2$ as a source gas) for sufficient time to convert about 1–2 nanometers of the outer surface of the tungsten coating 12 into tungsten nitride. The tungsten nitride has a hardness exceeding that of tungsten and can thus further enhance the wear resistance of the tungsten coating 12.

The present invention can also be applied to form a conformal tungsten coating 12 on other Group IV elements. For example, diamond (C) surfaces within a MEM device can be coated with tungsten to provide for an increased optical reflectivity or electrical conductivity by cleaning the diamond surfaces using the steps described previously; and then exposing the heated diamond surfaces to $WF_6$ in an LPCVD system at an elevated temperature in the range of 200–600° C. to coat the diamond surfaces or exposed portions thereof with the tungsten coating 12.

Finally, the present invention can be applied to MEM devices formed of III–V compound semiconductors (e.g. gallium arsenide). Such III–V MEM devices can be used, for example, to form chemical sensors (e.g. based on the optical or piezoelectric properties of gallium arsenide or another III–V compound semiconductor) or optical MEM devices.

The matter set forth in the foregoing description and accompanying drawings is offered by way of illustration only and not as a limitation. Other applications and variations of the present invention will become evident to those skilled in the art. The actual scope of the invention is intended to be defined in the following claims when viewed in their proper perspective based on the prior art.

What is claimed is:

1. A method for forming a tungsten coating on a semiconductor surface within a microelectromechanical (MEM) device, comprising steps for:
    (a) cleaning the semiconductor surface in an oxidizing ambient and thereby substantially removing any organic material from the surface;
    (b) cleaning the semiconductor surface with a fluid comprising hydrofluoric acid (HF) thereby substantially removing any oxide film from the surface;
    (c) cleaning the semiconductor surface by heating the surface to a temperature in the range of 200–600° C. in the presence of gaseous nitrogen trifluoride ($NF_3$); and
    (d) heating the semiconductor surface to a temperature in the range of 200–600° C. in the presence of gaseous tungsten hexafluoride ($WF_6$) and thereby forming the tungsten coating by a chemical reaction of the semiconductor surface with the gaseous tungsten hexafluoride.

2. The method of claim 1 wherein the semiconductor surface comprises monocrystalline silicon.

3. The method of claim 1 wherein the semiconductor surface comprises polycrystalline silicon.

4. The method of claim 1 wherein the semiconductor surface comprises germanium.

5. The method of claim 1 wherein the semiconductor surface comprises silicon carbide.

6. The method of claim 1 wherein the step for cleaning the semiconductor surface in the oxidizing ambient comprises exposing the semiconductor surface to an oxygen plasma.

7. The method of claim 1 wherein the step for cleaning the semiconductor surface in the oxidizing ambient comprises exposing the semiconductor surface to a cleaning solution comprising hydrogen peroxide ($H_2O_2$).

8. The method of claim 7 wherein the cleaning solution further comprises sulfuric acid ($H_2SO_4$).

9. The method of claim 8 wherein the cleaning solution comprises a mixture of sulfuric acid ($H_2SO_4$) and hydrogen peroxide ($H_2O_2$) in the range of 5:1 $H_2SO_4$:$H_2O_2$ to 10:1 $H_2SO_4$:$H_2O_2$ at a temperature in the range of 60–130° C.

10. The method of claim 9 wherein the step for cleaning the semiconductor surface in the oxidizing ambient proceeds for a time duration in the range of 0.5–10 minutes.

11. The method of claim 1 wherein the step for cleaning the silicon surfaces with the fluid comprising hydrofluoric acid comprises cleaning the semiconductor surface with a buffered oxide etchant for a time duration in the range of 0.5–10 minutes.

12. The method of claim 11 wherein the buffered oxide etchant comprises a mixture of 6:1 of ammonium hydroxide ($NH_4OH$):HF.

13. The method of claim 1 wherein the step for cleaning the semiconductor surface with a fluid comprising hydrofluoric acid comprises cleaning the semiconductor surface with a mixture in the range of 1–100 parts water to 1 part hydrofluoric acid for a time duration in the range of 0.5–10 minutes.

14. The method of claim 1 wherein the step for cleaning the semiconductor surface with a fluid comprising hydrofluoric acid comprises cleaning the semiconductor surface with gaseous HF.

15. The method of claim 1 wherein the step for cleaning the semiconductor surface by heating the surface to a temperature in the range of 200–600° C. in the presence of gaseous nitrogen trifluoride proceeds for a time duration of about ten minutes or less.

16. The method of claim 15 wherein the temperature is about 450° C.

17. The method of claim 1 wherein the tungsten coating is formed to a layer thickness of 5–50 nanometers.

18. The method of claim 1 wherein the step for heating the semiconductor surface to a temperature in the range of 200–600° C. in the presence of gaseous tungsten hexafluoride ($WF_6$) and thereby forming the tungsten coating by a chemical reaction of the semiconductor surface with the gaseous tungsten hexafluoride substantially terminates when the tungsten coating reaches a layer thickness in the range of 5–50 nanometers.

19. The method of claim 1 wherein the step for heating the semiconductor surface to a temperature in the range of 200–600° C. in the presence of gaseous tungsten hexafluoride ($WF_6$) and thereby forming the tungsten coating by a chemical reaction of the semiconductor surface with the gaseous tungsten hexafluoride proceeds for a time duration in the range of 0.5–20 minutes.

20. The method of claim 19 wherein the temperature is about 450° C.

21. A method for forming a wear-resistant coating on a semiconductor surface within a microelectromechanical (MEM) device, comprising steps for:
(a) cleaning the semiconductor surface; and
(b) exposing the semiconductor surface to tungsten hexafluoride ($WF_6$) at an elevated temperature, thereby chemically reacting the tungsten hexafluoride with the semiconductor surface and forming a conformal tungsten coating with a layer thickness in the range of 5–50 nanometers over the semiconductor surface.

22. The method of claim 21 wherein the semiconductor surface comprises a semiconductor selected from the group consisting of silicon, germanium, silicon-germanium, and silicon carbide.

23. The method of claim 22 wherein the semiconductor surface comprises monocrystalline silicon.

24. The method of claim 22 wherein the semiconductor surface comprises polycrystalline silicon.

25. The method of claim 21 wherein the step for cleaning the semiconductor surface comprises substantially removing any organic material from the semiconductor surface by exposing the semiconductor surface to an oxidizing ambient.

26. The method of claim 25 wherein the step for cleaning the semiconductor surface in the oxidizing ambient proceeds for a time duration in the range of 0.5–10 minutes.

27. The method of claim 25 wherein the oxidizing ambient comprises an oxygen plasma.

28. The method of claim 25 wherein the oxidizing ambient comprises a cleaning solution which further comprises hydrogen peroxide ($H_2O_2$).

29. The method of claim 28 wherein the cleaning solution further comprises sulfuric acid ($H_2SO_4$).

30. The method of claim 29 wherein the cleaning solution comprises 5:1 $H_2SO_4:H_2O_2$ to 10:1 $H_2SO_4:H_2O_2$ at a temperature in the range of 60–130° C.

31. The method of claim 25 wherein the step for cleaning the semiconductor surface further comprises a step for substantially removing any oxide film from the semiconductor surface using a fluid comprising hydrofluoric acid (HF).

32. The method of claim 31 wherein the fluid comprising hydrofluoric acid is an aqueous HF solution.

33. The method of claim 31 wherein the fluid comprising hydrofluoric acid is gaseous HF.

34. The method of claim 31 wherein the fluid comprising hydrofluoric acid is a buffered oxide etchant further comprising ammonium hydroxide ($NH_4OH$).

35. The method of claim 31 wherein the step for cleaning the semiconductor surface further comprises a step for heating the semiconductor surface to a temperature in the range of 200–600° C. and exposing the heated semiconductor surface to gaseous nitrogen trifluoride ($NF_3$) for a time duration of about ten minutes or less.

36. The method of claim 35 wherein the semiconductor surface is heated to about 450° C.

37. The method of claim 21 wherein the step for exposing the semiconductor surface to tungsten hexafluoride at the elevated temperature comprises heating the semiconductor surface to a temperature in the range of 200–600° C.

38. The method of claim 37 wherein the step for exposing the semiconductor surface to tungsten hexafluoride at the elevated temperature proceeds for a time duration in the range of 0.5–20 minutes.

39. The method of claim 37 wherein the semiconductor surface is heated to about 450° C.

40. The method of claim 37 wherein the conformal tungsten coating has a layer thickness in the range of 5–50 nanometers.

41. A method for forming a microelectromechanical (MEM) device having improved wear resistance, comprising steps for:
(a) fabricating the MEM device by depositing and patterning a plurality of semiconductor layers and a plurality of layers of a sacrificial material;
(b) releasing the MEM device for operation by removing at least a part of the layers of the sacrificial material by etching;
(c) cleaning the MEM device to substantially remove any organic and oxide material from exposed surfaces of the semiconductor layers; and
(d) forming a conformal tungsten coating over the exposed surfaces of the semiconductor layers in the MEM device by reacting the exposed surfaces of the semiconductor layers with gaseous tungsten hexafluoride ($WF_6$) at an elevated temperature.

42. The method of claim 41 wherein the step for cleaning the MEM device comprises steps for:
(a) removing any organic material from the exposed surfaces of the semiconductor layers by cleaning the exposed surfaces of the semiconductor layers in an oxidizing ambient;
(b) removing any oxide film from the exposed surfaces of the semiconductor layers by etching the exposed surfaces of the semiconductor layers with a fluid comprising hydrofluoric acid (HF); and
(c) heating the semiconductor layers to a temperature in the range of 200–600° C. in the presence of gaseous nitrogen trifluoride ($NF_3$).

43. The method of claim 42 wherein the semiconductor layers comprise silicon.

44. The method of claim 42 wherein the semiconductor layers comprise germanium.

45. The method of claim 42 wherein the semiconductor layers comprise silicon carbide.

46. The method of claim 41 wherein the elevated temperature is in the range of 200–600° C.

47. The method of claim 46 wherein the elevated temperature is about 450° C.

48. The method of claim 46 wherein the step for forming the conformal tungsten coating over the semiconductor layers within the MEM device by reacting the surfaces of the semiconductor layers with gaseous tungsten hexafluoride proceeds for a time duration in the range of 0.5–20 minutes.

49. The method of claim 46 wherein the conformal tungsten coating has a layer thickness in the range of 5–50 nanometers.

50. A wear-resistant coating formed on at least one semiconductor surface of a moveable member in a microelectromechanical (MEM) device, comprising a 5–50-nanometer-thick conformal coating of tungsten.

51. The wear-resistant coating of claim 50 wherein the semiconductor surface comprises silicon.

52. The wear-resistant coating of claim 50 wherein the semiconductor surface comprises germanium.

53. The wear-resistant coating of claim 50 wherein the moveable member comprises a rotary member which is rotatable about an angle of 360°.

54. The wear-resistant coating of claim 53 wherein the rotary member comprises a gear.

55. A wear-resistant coating formed on a moveable member in a microelectromechanical (MEM) device by chemically reacting gaseous tungsten hexafluoride ($WF_6$) with at least one exposed semiconductor surface of the moveable member at an elevated temperature in the range of 200 to 600° C. for sufficient time to form a 5–50-nanometer-thick conformal coating of tungsten over the exposed semiconductor surface.

56. The wear-resistant coating of claim 55 wherein the semiconductor surface comprises silicon.

57. The wear-resistant coating of claim 55 wherein the semiconductor surface comprises germanium.

58. The wear-resistant coating of claim 55 wherein the moveable member comprises a rotary member which is rotatable about an angle of 360°.

59. The wear-resistant coating of claim 58 wherein the rotary member comprises a gear.

\* \* \* \* \*